United States Patent
Sasaki et al.

(10) Patent No.: US 7,491,270 B2
(45) Date of Patent: Feb. 17, 2009

(54) HEAT SHIELD MEMBER AND SINGLE CRYSTAL PULLING DEVICE

(75) Inventors: Hitoshi Sasaki, Tokyo (JP); Syunji Kuragaki, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 11/577,989

(22) PCT Filed: Oct. 26, 2004

(86) PCT No.: PCT/JP2004/015827

§ 371 (c)(1),
(2), (4) Date: Apr. 25, 2007

(87) PCT Pub. No.: WO2006/046280

PCT Pub. Date: May 4, 2006

(65) Prior Publication Data

US 2008/0127886 A1    Jun. 5, 2008

(51) Int. Cl.
*C30B 35/00* (2006.01)
(52) U.S. Cl. .................. 117/200; 117/208; 117/213; 117/217; 117/900
(58) Field of Classification Search .............. 117/200, 117/208, 213, 217, 900
See application file for complete search history.

(56) References Cited

U.S. PATENT DOCUMENTS 6,702,892 B2   3/2004   Okui et al.

FOREIGN PATENT DOCUMENTS

| JP | 61-63593 | * | 4/1986 |
| JP | 05-294784 | | 11/1993 |
| JP | H10-158091 | | 6/1998 |
| JP | 11-209193 | * | 8/1999 |
| JP | 11-290792 | | 10/1999 |
| JP | 2000-007496 | | 1/2000 |
| JP | 2001-220289 | | 8/2001 |
| JP | 2002-047093 | * | 2/2002 |

OTHER PUBLICATIONS

Office Action issued on Jun. 24, 2008, on the counterpart Japanese Patent Application No. 2003-123193, and its English translation.

* cited by examiner

*Primary Examiner*—Felisa C Hiteshew
(74) *Attorney, Agent, or Firm*—Kolisch Hartwell, PC

(57) ABSTRACT

A heat shielding member 20 that thermally shields the periphery of a single crystal 16 used in a Czochralski single crystal pulling device that pulls the single crystal 16 from a melt 15 that is collected in a crucible 10 is disclosed. The heat shielding member 20 is provided with an approximately cylindrical main body portion 21 arranged so as to surround the single crystal 16, with a lower end portion thereof extending to the vicinity of the melt 15, and an approximately annular bottom plate portion 22 that extends in the diameter direction from the bottom end portion of the main body portion 21 to cover the melt. The bottom plate portion 22 is attached to the main body portion 21 in the state of being severed in the circumferential direction at at least one location. With this constitution it is possible to provide a heat shielding member with superior durability and a single crystal pulling device that employs the heat shielding member.

3 Claims, 2 Drawing Sheets

HEAT SHIELD MEMBER AND SINGLE CRYSTAL PULLING DEVICE

This application is a 371 of PCT/JP2004/015827, Oct. 26, 2004.

BACKGROUND OF THE INVENTION

1. Field of the Invention

The present invention relates to a Czochralski single crystal pulling device and to a heat shield member that is used therefor.

2. Description of the Related Art

The Czochralski method is a method conventionally known for growing a single crystal silicon. The Czochralski method involves melting a raw material in a crucible, immersing a seed crystal in the melt thereof, and then, while rotating the seed crystal and the crucible, slowly pulling the seed crystal up from the melt to make a single crystal silicon grow thereunder.

The quality of a single crystal that is grown by the Czochralski method is generally known to be dependent on the temperature during the growing process. Radiant heat from the melt in the crucible is given as a factor having a major effect on the temperature of the crystal. In order to control it, a heat shielding member made of graphite or the like is normally placed around the crystal being grown in the Czochralski single crystal pulling device (for example, refer to Japanese Unexamined Patent Application First Publication No. H05-294784 (pages 2 to 4) and Japanese Unexamined Patent Application First Publication No. H11-290792 (page 4)).

Also, in the aforementioned single crystal pulling device, an optical instrument is provided for controlling the pull-up speed by measuring in a non-contact way the diameter of the crystal being grown. Therefore, a notch portion (including a slit) is often provided in the heat shielding member in order to ensure the visual field.

In the aforementioned single crystal pulling device, the temperature in the chamber is maintained at not less than 1,000° C. during the pulling up of a single crystal. On the other hand, after completion of the pulling up of a single crystal, the temperature in the chamber is reduced to room temperature, and in this state the single crystal raw material used for the next pulling is supplied to the crucible. That is, an extremely large temperature difference occurs in the chamber between supplying of the raw material and pulling up of the single crystal, and this repeatedly occurs during the manufacturing process of a single crystal. Also, a portion, which faces the melt, is provided on the bottom end portion of the above-mentioned heat shielding member. A temperature difference of 100° C. to 200° C. occurs between the center portion and the peripheral portion of that portion due to the effects of inert gas that flows along the surface thereof and the relationship between the arrangement of the crucible and the heater.

For this reason, in the above-mentioned heat shielding member, large stresses may occur during use due to the effects of the aforementioned severe temperature changes that occur in the chamber and the severe temperature differences that occur in the material, as well as the residual stress in the material and the thermal expansion differential between a covering material for degradation prevention and the inner material or the like. Above all, stress tends to concentrate in the vicinity of a notch portion that is provided for the optical instrument, so that as material quality degradation progresses with repeated use of the heat shielding member, there is a possibility of failure occurring during use. In such a situation, fragments or the like of the heat shielding member would become mixed with the melt in the crucible, rendering the melt unusable, and may become a cause for lowering the yield. In order to avoid this, it is conceivable to replace the heat shielding member before material quality degradation advances. However, since the heat shielding member itself is a comparatively expensive component, frequently replacing it would lead to a cost increase.

The present invention was achieved in view of the aforementioned circumstances, and has as its object to provide a heat shielding member with excellent durability that can relieve thermal stress that occurs in the material, and a single crystal pulling device that uses the heat shielding member.

SUMMARY OF THE INVENTION

The first aspect of the present invention is, in a Czochralski single crystal pulling device that pulls a single crystal from a melt that is collected in a crucible, a heat shielding member that thermally shields the periphery of the single crystal, which comprises an approximately cylindrical main body portion arranged so as to surround the single crystal, with a lower end portion thereof extending to the vicinity of the melt, and an approximately annular bottom plate portion that extends in the diameter direction from the bottom end portion of the main body portion to cover the melt, in which the bottom plate portion is attached to the main body portion in the state of being severed in the circumferential direction at least one location.

Here, the approximately cylindrical main body portion includes a cylindrical main body portion in which the diameter of both the top and bottom ends thereof are approximately the same dimension, and also includes a main body portion of an inverted truncated cone shape in which the diameter gradually narrows from the top end to the bottom end.

The approximately annular bottom plate portion includes a level bottom plate portion in which the heights of the inner circumference and the outer circumference are the same, and also includes an inclined bottom plate portion in which the inner circumference is positioned above or below the outer circumference.

A method of attaching the bottom plate portion to the main body portion includes, for example, providing a support portion that extends to the inner circumference side at the bottom end of the main body portion and attaching the bottom plate portion with the periphery of the bottom plate portion being placed on the upper side of the support portion.

According to the first aspect of the present invention, since the approximately annular bottom plate portion that covers the melt is attached to the main body portion in the state of being severed in the circumferential direction at least one location, it is possible to relieve thermal stress generated in the bottom plate portion and prevent thermal stress from concentrating in a particular portion of the heat shielding member. That is, in the case of the bottom plate portion being provided in a state of being continuous in the circumferential direction (i.e., without severed locations), free thermal expansion of the bottom plate portion is restricted, thereby leading to the possibility of large thermal stress being generated during use. According to the present invention, by severing the bottom plate portion in the circumferential direction at least one location, it is possible to prevent the generation of the aforementioned large thermal stress. As a result, even if material quality degradation progresses, failure of the heat shielding member is hindered, and so it is possible to increase the durability of the heat shielding member. Also, since failure of the heat shielding member is hindered, the material cost can be reduced.

The second aspect of the present invention is characterized by a notch portion being provided at the bottom plate portion of the heat shielding member according to the first aspect of the present invention and the bottom plate portion being severed along a line that passes through the notch portion.

Here, the notch portion includes a notch portion that is formed so as to notch a portion of the inner circumference or the outer circumference of the bottom plate portion as well as an opening portion that is formed between the inner circumference and the outer circumference. Also, the notch portion is one not limited to a notch portion that is formed for securing the visual field of an optical instrument, but may be a notch portion that is formed for another use.

According to the second aspect of the present invention, since the bottom plate portion is severed along a line that passes through the notch portion, it is possible to prevent thermal stress from concentrating around the notch portion and possible to further improve the durability of the heat shielding member.

The third aspect of the present invention is a Czochralski single crystal pulling device that pulls a single crystal from a melt that is collected in a crucible, characterized by using the heat shielding member according to first or second aspect of the present invention as a heat shielding member that surrounds the periphery of the single crystal.

According to the third aspect of the present invention, since the heat shielding member according to first or second aspect of the present invention is used as a heat shielding member that surrounds the periphery of the single crystal, the durability of the heat shielding member improves beyond conventional durability, and a reduction in the cost of manufacturing a single crystal can be achieved. Also, it is possible to reduce the occurrence of such a problem as failure of the heat shielding member during use, and thereby possible to improve the yield.

As described above, the present invention can relieve thermal stress generated in the bottom plate portion and prevent thermal stress from concentrating in a particular location of the heat shielding member. Accordingly, it is possible to improve the durability of the heat shielding member and reduce the costs of manufacturing a single crystal.

DETAILED DESCRIPTION OF THE INVENTION

Figure 1:
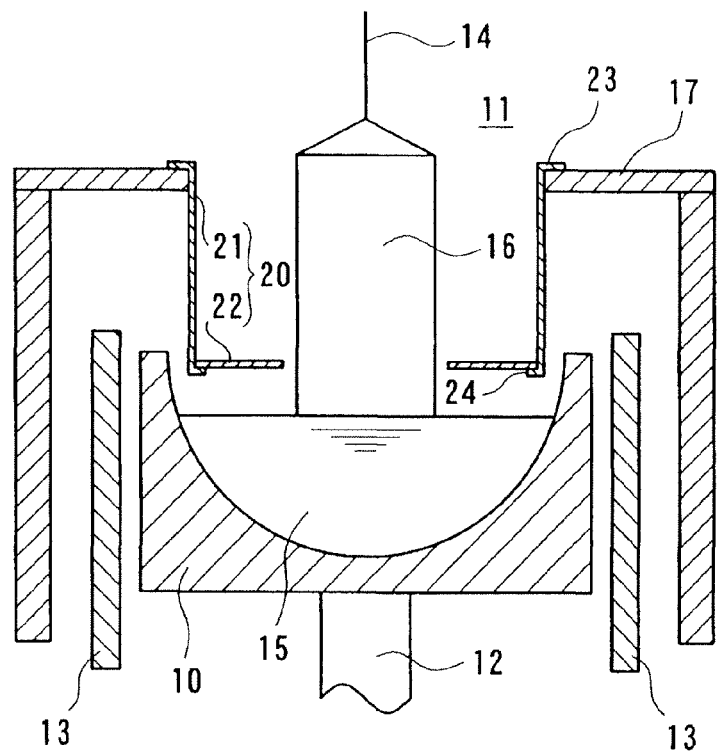
FIG. 1 is a sectional view showing one embodiment of the single crystal pulling device according to the present invention.

FIGS. 1 to 3B show one embodiment of a heat shielding member and a single crystal pulling device employing the heat shielding member according to the present invention. In the drawings, reference number 10 denotes a crucible. This crucible 10 consists of an inner layer container made from quartz and an outer layer container made from graphite and, as shown in FIG. 1, is accommodated in a chamber 11 in a state of being supported by a support shaft 12 in a rotatable and elevatable manner. A heater 13 is disposed around the crucible 10, following the outer circumference thereof, and a pull-up shaft 14, which is rotatable and elevatable, is provided above the crucible 10 in the opposite direction of the support axis 12. A seed crystal (not illustrated) is attached to the bottom end portion of the pull-up shaft 14. By immersing the seed crystal in a melt 15 inside the crucible 10 and then slowly pulling the seed crystal up from the melt 15 while making the pull-up shaft 14 and the support shaft 12 rotate in opposite directions, a single crystal silicon 16 grows at the bottom thereof.

Also, an optical instrument (not illustrated) for measuring the diameter of the aforementioned single crystal 16 being grown is provided at a predetermined position in the chamber 11. The pull-up speed or the like of the seed crystal is controlled based on the measurement value of this optical instrument.

As shown in FIG. 1, a heat shielding member 20 that thermally shields the periphery of the aforementioned single crystal 16 being grown is provided above the crucible 10. This heat shielding member 20 includes an approximately cylindrical main body portion 21 that is arranged so as to surround the single crystal 16, with a lower end portion thereof extending to the vicinity of the melt 15 in the crucible 10, and an approximately annular bottom plate portion 22 that is disposed at the bottom end portion of the main body portion 21 in the state of facing the melt 15. The main body portion 21 and the bottom plate portion 22 are both made of graphite or carbon-carbon composite materials or the like and the surfaces thereof are coated with silicon carbide (SiC).

Figure 2:
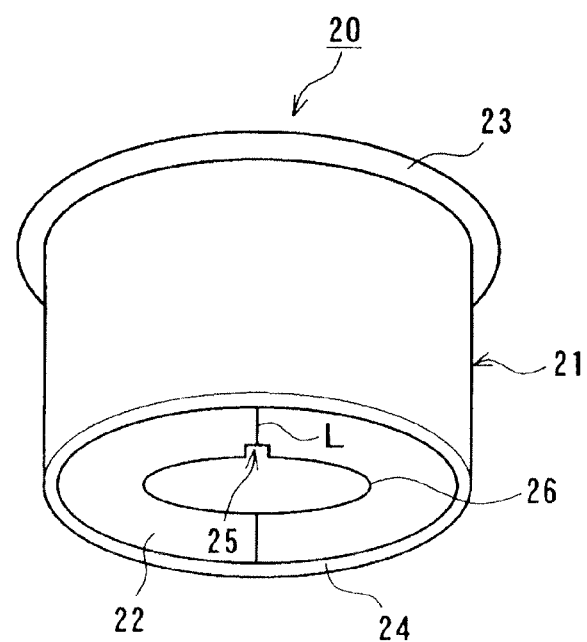
FIG. 2 is a perspective view showing the heat shielding member of FIG. 1.

As shown in FIGS. 1 and 2, a flange portion 23 for making the heat shielding member 20 engage with a frame 17 in the chamber 11 is provided at the top end portion of the main body portion 21. A support portion 24 which supports the peripheral edge portion of the bottom plate portion 22 is provided at the bottom end portion of the main body portion 21 in the state of extending to the inner circumference side of the main body portion 21.

Figure 3A:
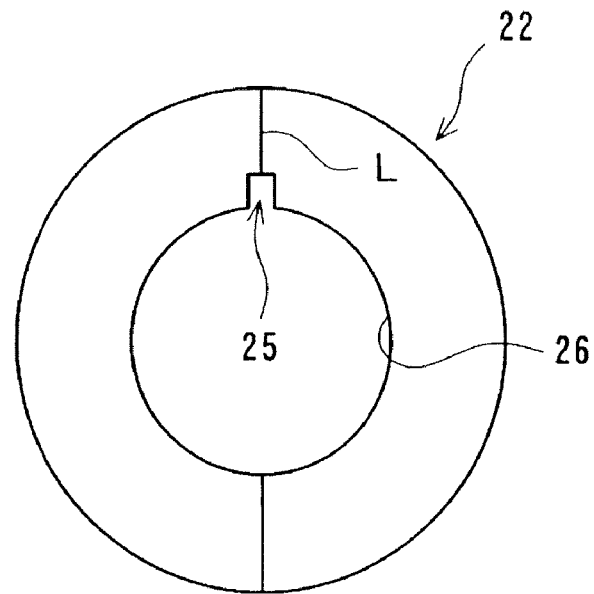
FIG. 3A is a plan view showing the bottom plate portion of the heat shielding member of FIG. 1.
Figure 3B:
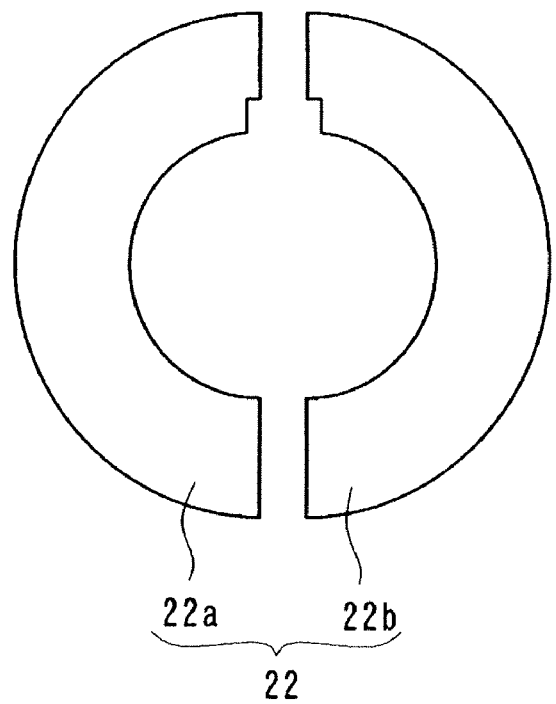
FIG. 3B is a plan view showing the bottom plate portion of the heat shielding member of FIG. 1.

In the center of the bottom plate portion 22, an opening portion 26 for allowing the aforementioned single crystal 16 to pass therethrough is provided. As shown in FIG. 2 and FIGS. 3A and 3B, on the inner circumference of the bottom plate portion 22, a notch portion 25 for securing the visual field of the optical instrument is formed. The aforementioned bottom plate portion 22 is attached to the main body portion 21 in the state of being severed in the circumferential direction along a line that passes through the notch portion 25 to be plurally divided (here, in a state of being divided in half along a diameter L that passes through the notch portion 25).

In the case of growing the single crystal silicon 16 using the single crystal pulling device having the aforedescribed constitution, first, polycrystalline silicon, which is the raw material, is supplied to the crucible 10, and then, after vacuum evacuation of the chamber 11, the heater 13 is activated in the state of introducing an inert gas to flow therein and the raw material in the crucible 10 is melted. Next, the seed crystal attached to the bottom end portion of the pull-up shaft 14 is immersed in the melt 15 in the crucible 10, and from this state the pull-up shaft 14 is raised while making the pull-up shaft 14 and the support shaft 12 rotate in opposite directions. Thereby, the single crystal silicon 16 is grown under the seed crystal.

In this case, since the periphery of the single crystal silicon 16 is surrounded by the heat shielding member 20, the radiant heat or the like emitted from the melt 15 in the crucible 10 is blocked by the heat shielding member 20. Accordingly, by preventing a rise in temperature of the single crystal 16, the single crystal 16 can be readily controlled to a temperature set in advance, and fluctuations in quality stemming from temperature control of the single crystal 16 can be reduced.

Moreover, according to the heat shielding member 20 of the present embodiment, since the annular bottom plate portion 22 that faces the melt 15 is attached to the main body portion 21 in the state of being severed in the circumferential direction at a plurality of locations, thermal stress generated in the bottom plate portion 22 can be relieved. In particular, in this embodiment, since the bottom plate portion 22 is divided along a line (diameter L) that passes through the notch portion 25, thermal stress can be prevented from concentrating on the perimeter of the notch portion 25. Accordingly, it is possible to improve the durability of the heat shielding member 20 and hinder failure of the heat shielding member 20 even when material quality degradation has advanced.

As a result, it is possible to reduce the occurrence of such a problem as failure of the heat shielding member 20 during use, and thereby possible to improve the yield.

Moreover, in this embodiment, since the bottom plate portion 22 is divided into two by the diameter L passing through the notch portion 25 as a dividing line, split pieces 22a and 22b thereof can each be held in a stable state so as not to fall from the main body portion 21.

In this embodiment, the annular bottom plate portion 22 was divided into two by severing the bottom plate portion 22 at two locations, but the present invention is not limited thereto. For example, it is possible to adopt a constitution that severs the bottom plate portion 22 at three or more locations so as to divide the bottom plate portion 22 into three or more pieces, or a constitution that severs the bottom plate portion 22 at only one location so as not to plurally divide the bottom plate portion 22.

As described above, the present invention can relieve thermal stress generated in the bottom plate portion and prevent thermal stress from concentrating in a particular portion of the heat shielding member. Accordingly, it is possible to improve the durability of the heat shielding member and reduce the costs of manufacturing a single crystal.

What is claimed is:

1. A heat shielding member, which thermally shields the periphery of a single crystal, which is used in a Czochralski single crystal pulling device that pulls the single crystal from a melt that is collected in a crucible, comprising:

a substantially cylindrical main body portion arranged so as to surround the single crystal, with a lower end portion thereof extending to the vicinity of the melt;

a substantially annular bottom plate portion that extends in the diameter direction from the bottom end portion of the main body portion to cover the melt, and a support portion that extends to the inner circumference side of the main body portion provided in the bottom end portion of the main body portion, wherein the bottom plate portion is detachably placed on the support portion and is attached to the main body portion in the state of being severed in the circumferential direction at at least one location.

2. The heat shielding member according to claim 1, wherein the bottom plate portion further comprises a notch portion, and the bottom plate portion is severed along a line that passes through the notch portion.

3. A Czochralski single crystal pulling device that pulls a single crystal from a melt that is collected in a crucible, in which the heat shielding member according to claim 1 or claim 2 is employed as a heat shielding member that surrounds the periphery of the single crystal.

* * * * *